US008939397B2

(12) United States Patent
Brunetti et al.

(10) Patent No.: US 8,939,397 B2
(45) Date of Patent: Jan. 27, 2015

(54) AIRCRAFT CAPABLE OF HOVERING HAVING AN EXHAUST DUCT WITH THERMOELECTRIC CONVERSION CIRCUIT

(75) Inventors: Massimo Brunetti, Samarate (IT); Andrea Cogliati, Samarate (IT); Dario Iannucci, Samarate (IT); Alessandro Scandroglio, Samarate (IT)

(73) Assignee: Agustawestland S.p.A., Samarate (IT)

( * ) Notice: Subject to any disclaimer, the term of this patent is extended or adjusted under 35 U.S.C. 154(b) by 267 days.

(21) Appl. No.: 13/422,855

(22) Filed: Mar. 16, 2012

(65) Prior Publication Data

US 2012/0233988 A1 Sep. 20, 2012

(30) Foreign Application Priority Data

Mar. 18, 2011 (EP) .................................. 11425066

(51) Int. Cl.
| | | |
|---|---|---|
| *B64B 1/24* | (2006.01) | |
| *B64D 27/00* | (2006.01) | |
| *B64D 29/00* | (2006.01) | |
| *B64D 31/00* | (2006.01) | |
| *B64D 33/00* | (2006.01) | |
| *B64D 35/00* | (2006.01) | |
| *B64D 33/04* | (2006.01) | |
| *F01D 25/30* | (2006.01) | |
| *F02K 1/82* | (2006.01) | |
| *H01L 35/30* | (2006.01) | |

(52) U.S. Cl.
CPC ............... *B64D 33/04* (2013.01); *F01D 25/30* (2013.01); *F02K 1/82* (2013.01); *H01L 35/30* (2013.01); *B64D 2033/045* (2013.01); *F05D 2220/329* (2013.01); *F05D 2220/60* (2013.01); *Y02T 50/671* (2013.01); *Y02T 50/53* (2013.01)

USPC ........ 244/53 R; 244/57; 244/53 B; 244/17.11

(58) Field of Classification Search
None
See application file for complete search history.

(56) References Cited

U.S. PATENT DOCUMENTS

| | | | | |
|---|---|---|---|---|
| 3,879,229 | A | * | 4/1975 | Gilbert ......................... 136/208 |
| 4,018,046 | A | * | 4/1977 | Hurley ........................... 60/264 |
| 4,291,530 | A | * | 9/1981 | Ballard ..................... 60/39.092 |
| 4,566,270 | A | * | 1/1986 | Ballard et al. .................. 60/264 |

(Continued)

FOREIGN PATENT DOCUMENTS

| | | |
|---|---|---|
| DE | 24 33 591 A | 1/1976 |
| DE | 24 33 591 A1 | 1/1976 |

(Continued)

OTHER PUBLICATIONS

Machine translation of WO 2010/089505 A1 powered by Google; translated Mar. 20, 2014.*

(Continued)

*Primary Examiner* — Tien Dinh
*Assistant Examiner* — Michael A Fabula
(74) *Attorney, Agent, or Firm* — Ohlandt Greeley Ruggiero & Perle L.L.P.

(57) ABSTRACT

An aircraft, capable of hovering, having drive means; and at least one exhaust duct connected to an outlet of the drive means to expel the exhaust gas, produced by fuel combustion, from the aircraft. At least part of the exhaust duct has a thermoelectric conversion circuit for Seebeck-effect converting to electric energy the thermal gradient produced between the inside and outside of the exhaust duct by flow of the exhaust gas.

12 Claims, 6 Drawing Sheets

(56) References Cited

U.S. PATENT DOCUMENTS

| | | | |
|---|---|---|---|
| 5,554,819 A | 9/1996 | Baghai-Kermani | |
| 5,699,965 A * | 12/1997 | Amelio | 239/127.3 |
| 6,134,879 A * | 10/2000 | Frawley et al. | 60/39.5 |
| 7,985,918 B2 * | 7/2011 | Lindstrom | 136/200 |
| 8,484,983 B2 * | 7/2013 | Gao et al. | 60/785 |
| 2005/0241690 A1 * | 11/2005 | Tajima et al. | 136/212 |
| 2006/0118157 A1 * | 6/2006 | Johnson et al. | 136/205 |
| 2008/0173768 A1 * | 7/2008 | Chaniot et al. | 244/53 B |
| 2008/0223632 A1 * | 9/2008 | Bartilson | 180/65.2 |
| 2009/0159110 A1 * | 6/2009 | Kwok et al. | 136/205 |
| 2011/0131999 A1 * | 6/2011 | Gao et al. | 60/782 |
| 2011/0283712 A1 * | 11/2011 | Brillet | 60/801 |
| 2012/0031067 A1 * | 2/2012 | Sundaram et al. | 60/39.01 |
| 2012/0118345 A1 * | 5/2012 | Stoia et al. | 136/205 |

FOREIGN PATENT DOCUMENTS

| | | |
|---|---|---|
| WO | WO 01/61768 A1 | 8/2001 |
| WO | WO 2010/089505 A1 | 8/2010 |
| WO | WO 2010/128241 A2 | 11/2010 |

OTHER PUBLICATIONS

European Search Report dated Aug. 11, 2011 for corresponding European Application No. 11 42 5066.

* cited by examiner

AIRCRAFT CAPABLE OF HOVERING HAVING AN EXHAUST DUCT WITH THERMOELECTRIC CONVERSION CIRCUIT

CROSS REFERENCE TO RELATED APPLICATIONS

This application claims benefit under 35 U.S.C. §119(a) of European Patent Application No. 11425066.5, filed Mar. 18, 2011, the entire contents of which are incorporated herein by reference.

The present invention relates to an aircraft capable of hovering, in particular a helicopter, to which the following description refers purely by way of example, or a convertiplane.

BACKGROUND OF THE INVENTION

As is known, minimizing fuel consumption and, therefore, $CO_2$ emissions, is a major issue in the helicopter industry.

Research in this sector is also primarily aimed at improving flight safety, extending fuel range to permit longer missions, and significantly improving speed and acceleration performance, particularly in severe, e.g. high-altitude, flying conditions.

SUMMARY OF THE INVENTION

It is an object of the present invention to provide an aircraft, capable of hovering, designed to achieve at least one of the above objectives in a simple, low-cost manner.

According to the present invention, there is provided an aircraft, capable of hovering, comprising drive means; and at least one exhaust duct connected to an outlet of said drive means to expel the exhaust gas, produced by fuel combustion, from the aircraft; the aircraft being characterized in that at least part of said exhaust duct comprises a thermoelectric conversion circuit for Seebeck-effect converting to electric energy the thermal gradient produced between the inside and outside of the exhaust duct by flow of said exhaust gas.

BRIEF DESCRIPTION OF THE DRAWINGS

A preferred, non-limiting embodiment of the present invention will be described by way of example with reference to the accompanying drawings, in which.

DETAILED DESCRIPTION OF THE INVENTION

Figure 1:
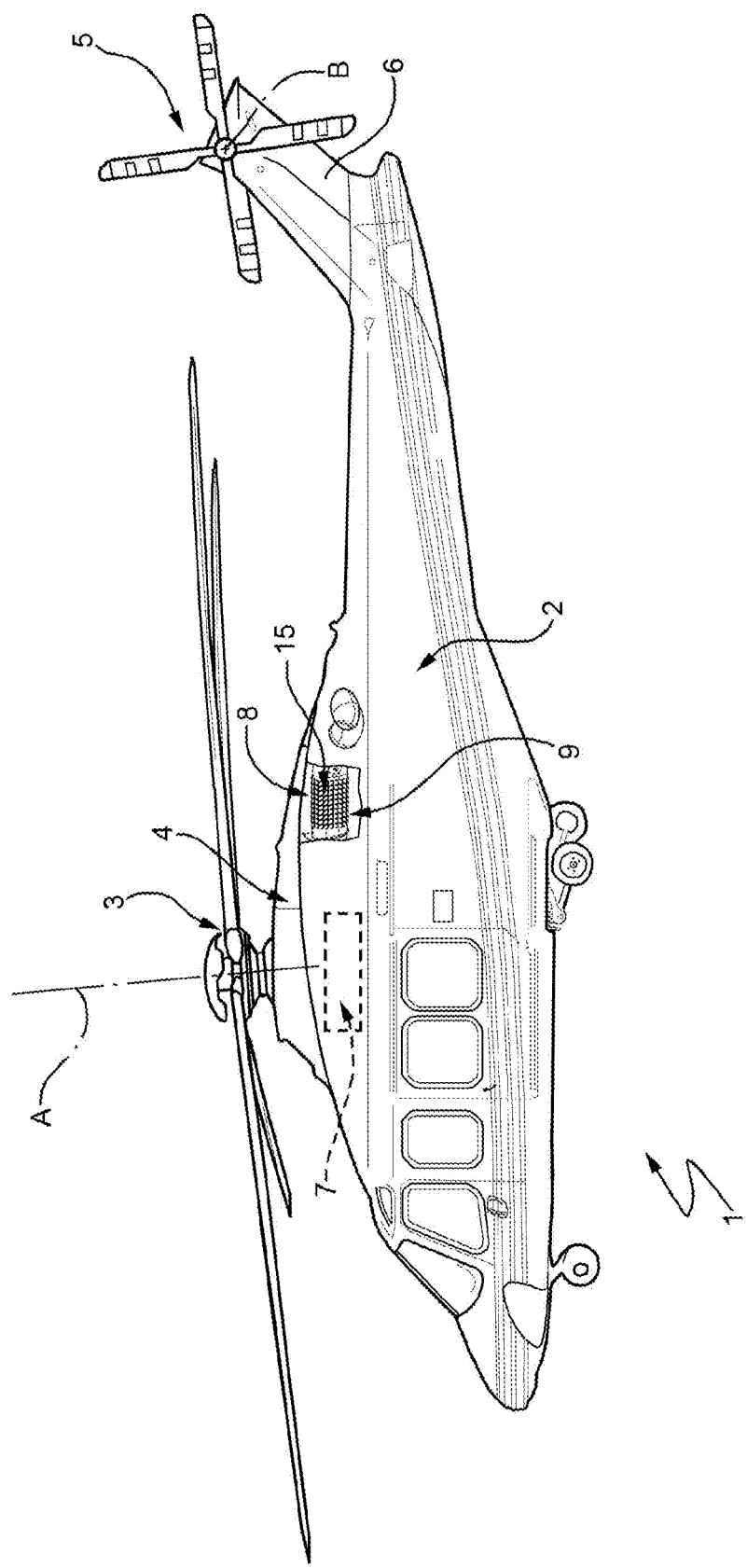
FIG. 1 shows a view in perspective, with parts removed for clarity, of a helicopter in accordance with the teachings of the present invention.

Number 1 in FIG. 1 indicates as a whole a helicopter substantially comprising a fuselage 2 housing the crew and on-board equipment; a main rotor 3 mounted on the top 4 of a central portion of fuselage 2, and which rotates about an axis A to sustain helicopter 1; and a tail rotor 5, which is fitted to a tail fin 6 projecting from a rear end portion of fuselage 2, and rotates about an axis B crosswise to axis A.

Helicopter 1 also comprises, in the top centre portion of fuselage 2, known drive means 7 (only shown schematically) for driving main rotor 3 and tail rotor 5 via respective known transmissions not shown.

Helicopter 1 comprises two exhaust ducts 8 (only one shown in FIG. 1) connected to respective outlets of drive means 7 to expel the exhaust gas, produced by fuel combustion, from helicopter 1.

As shown in FIG. 1, with the exception of the end portion from which exhaust gas is expelled into the atmosphere, exhaust ducts 8 extend inside respective bays 9 (only one shown in FIG. 1) formed in top 4 of fuselage 2 and ventilated by outside airflow produced by forward flight, or even simply by movement of main rotor 3.

Exhaust ducts 8 being identical, only one will be described for the sake of simplicity.

Figure 2:
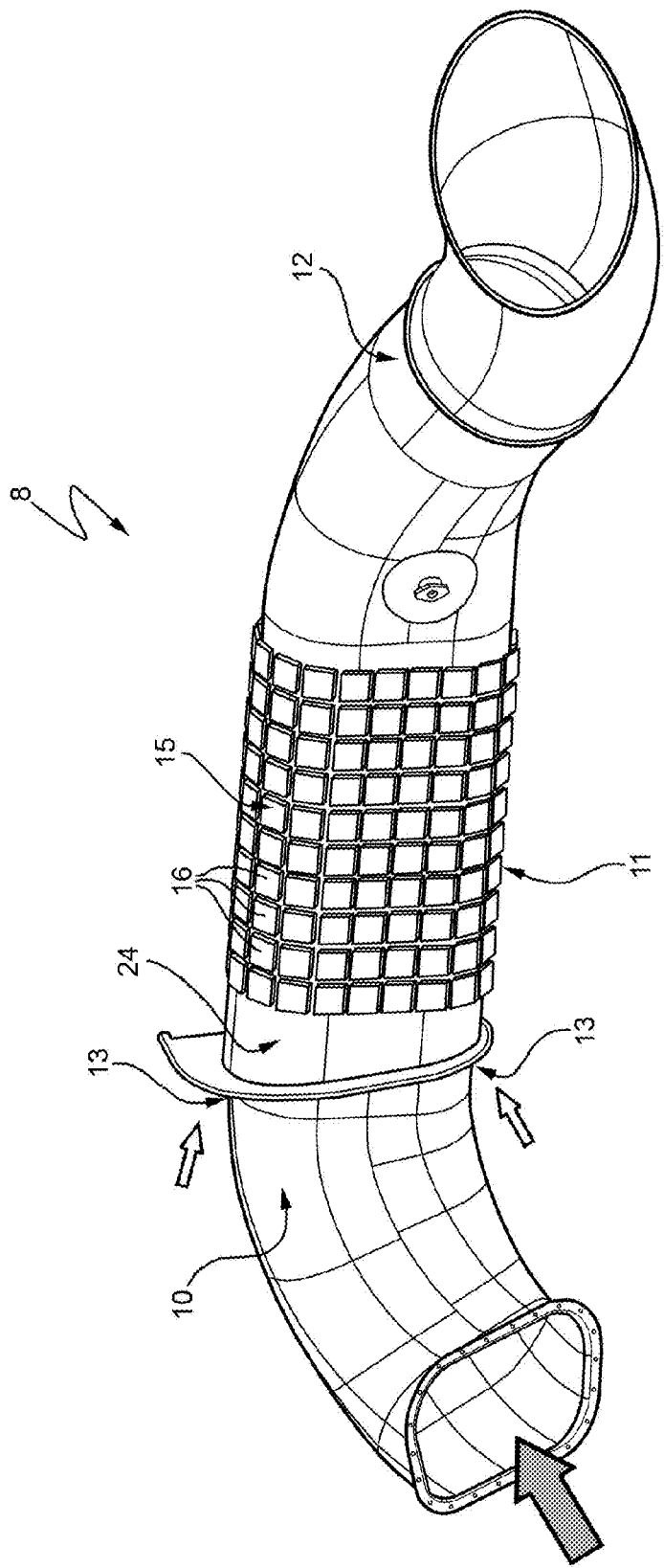
FIG. 2 shows a larger-scale view in perspective, with parts removed for clarity, of an exhaust duct of the FIG. 1 helicopter, fitted with thermoelectric modules for generating electric energy.
Figure 5:
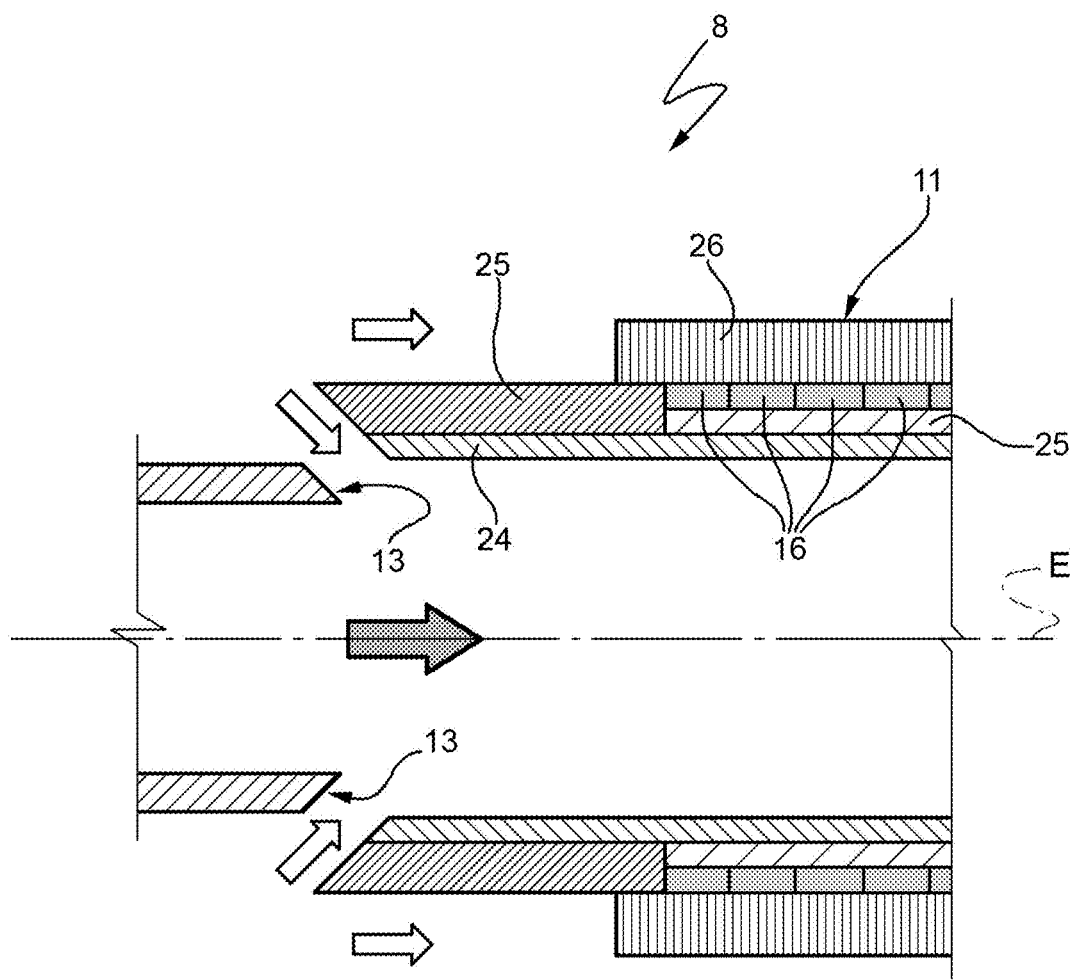
FIG. 5 shows a larger-scale axial section of part of the FIG. 2 exhaust duct.

With reference to FIGS. 2 and 5, exhaust duct 8 has a longitudinal axis E and comprises an intake portion 10 connected to the respective outlet of drive means 7; an intermediate portion 11 where the first exhaust gas cooling stage takes place; and an exhaust portion 12 from which fully cooled exhaust gas is expelled into the atmosphere.

At least intermediate portion 11 of exhaust duct 8 advantageously comprises a thermoelectric conversion circuit 15 for Seebeck-effect converting to electric energy the thermal gradient produced between the inside and outside of exhaust duct 8 by flow of the exhaust gas.

Exhaust duct 8 comprises two air intakes 13 for conducting outside airflow partly into duct 8.

Air intakes 13 are formed at the inlet to intermediate portion 11 of exhaust duct 8, close to intake portion 10; in particular, air intakes 13 are arranged upstream of thermoelectric circuit 15 with reference to the direction in which exhaust gas flows inside the exhaust duct 8.

Air intakes 13 are inclined with respect to axis E of exhaust duct 8 and converge towards said axis E along the flow direction of the exhaust gas so that the outside airflow mixes with the exhaust gas and locally lowers the temperature of such exhaust gas at the thermoelectric circuit 15.

Thanks to their inclination, air intakes 13 convey the outside airflow into the exhaust duct 8 along the same flow direction of the exhaust gas so as to mix with the latter without hampering advancing thereof and locally lowering its temperature. In practice, air intakes 13 permit, in a low-cost and straightforward manner, an effective control of the thermal gradient acting on thermoelectric circuit 15 and also prevent the maximum operating temperature of thermoelectric circuit 15 from being exceeded.

Figure 3:
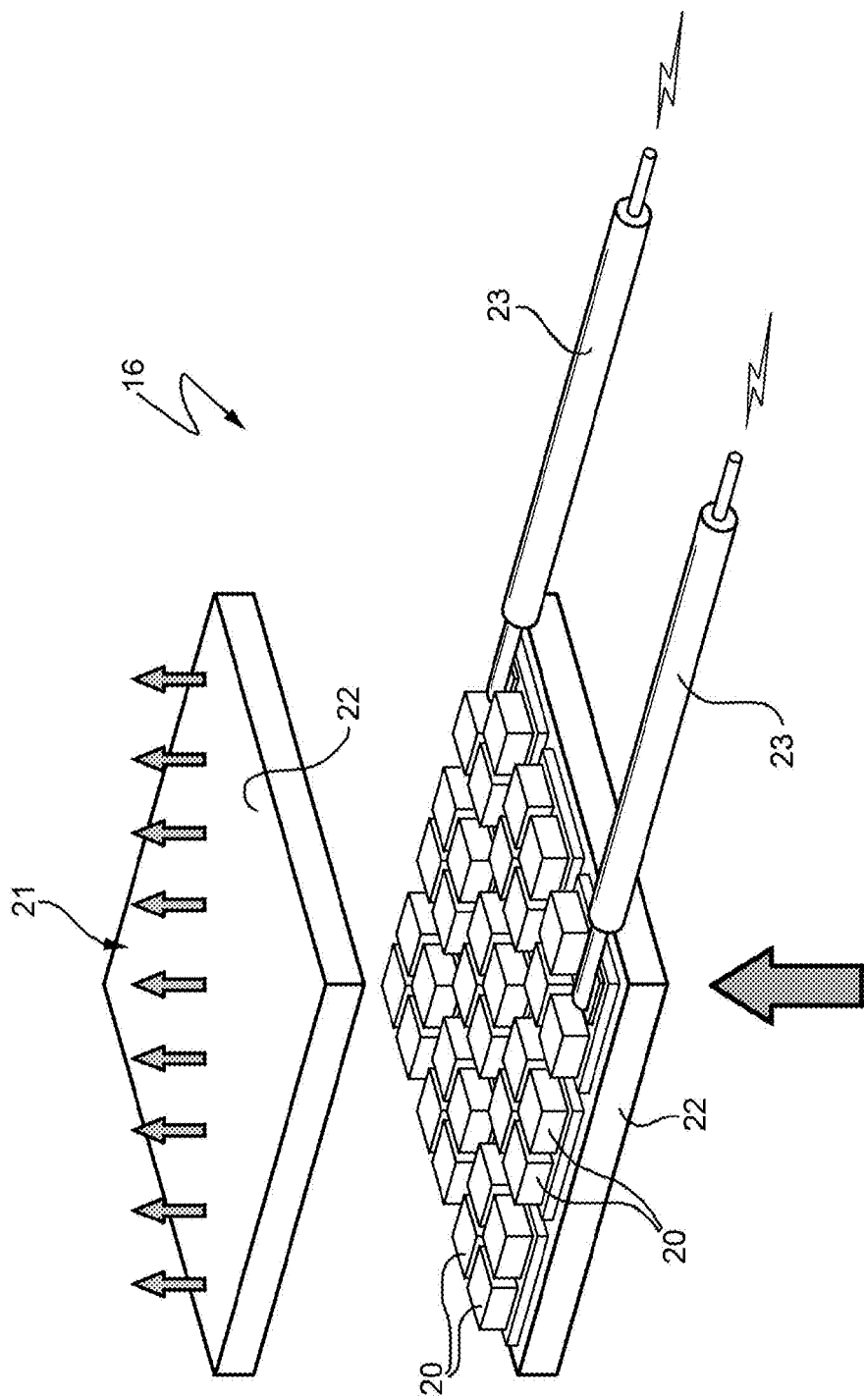
FIG. 3 shows a larger-scale, exploded view in perspective of a thermoelectric module of the FIG. 2 exhaust duct.

With reference to FIGS. 2, 3 and 5, thermoelectric circuit 15 comprises a series-parallel network of thermoelectric modules 16 subjected to said thermal gradient when drive means 7 are run.

As shown in FIG. 3, each thermoelectric module 16 comprises a number of semiconductor junction cells 20 fixed to a preferably ceramic substrate 21.

More specifically, cells 20 are P and N types, are fixed between two ceramic plates 22, and may, for example, be made of bismuth telluride.

Each thermoelectric module 16 also comprises electric connecting means 23 for connection to other thermoelectric modules 16 and to the electric system of helicopter 1.

In the FIG. 5 embodiment of the present invention, thermoelectric modules 16 are fixed to the outside of a portion of the wall 24 of exhaust duct 8 corresponding to intermediate portion 11.

More specifically, wall 24 is lagged with a layer 25 of heat-insulating material, on which thermoelectric modules 16 are fixed, e.g. glued. In other words, layer of heat-insulating material is interposed between wall 24 and thermoelectric modules 16.

The thickness and thermal conductivity of the heat-insulating material of layer 25 are selected so that, when helicopter 1 is running, the temperature to which thermoelectric modules 16 are subjected from inside exhaust duct 8 never exceeds the maximum operating temperature of modules 16.

As shown in FIG. 5, thermoelectric modules 16 are covered on the outside, i.e. the opposite side to that contacting layer 25 of heat-insulating material, with heat-dissipating means 26 made, for example, of aluminium alloys or graphene-based materials.

The structure described ensures thermoelectric modules 16 are subjected to the desired thermal gradient, i.e. the desired difference in temperature between the outer side of modules 16 contacting dissipating means 26, and the inner side of modules 16 contacting layer 25 of heat-insulating material.

In a preferred embodiment of the present invention, thermoelectric modules 16 are divided into groups, each comprising a given number of series-connected modules 16; and the number of modules 16 to connect in series is calculated by dividing the voltage level $V_0$ of the electric system of helicopter 1—normally 28 Vdc—by the voltage supply $V_M$ of each module 16.

The groups of modules 16 so calculated are then parallel-connected to one another to minimize the total resistance of thermoelectric circuit 15.

Figure 4:
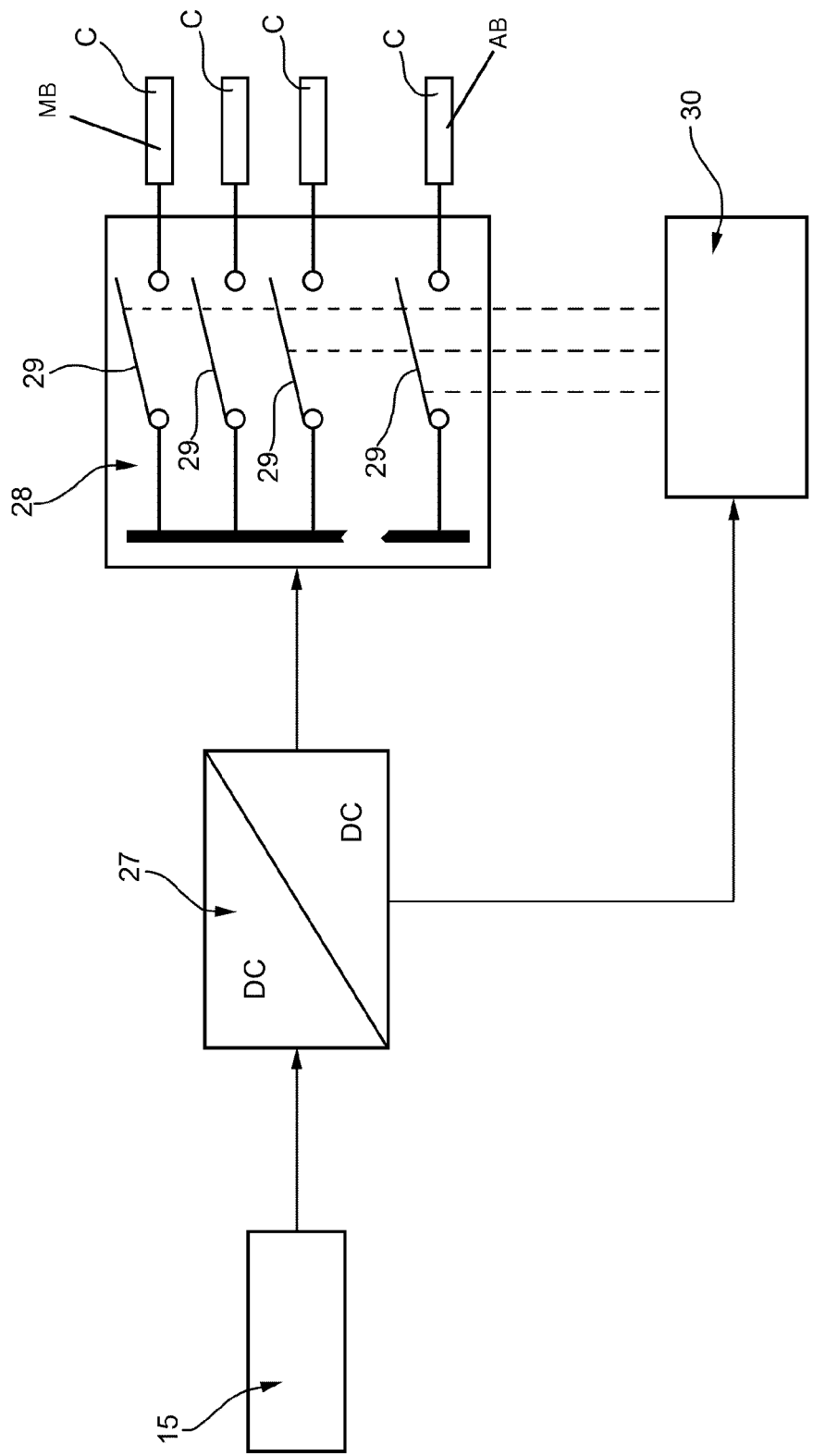
FIG. 4 shows a block diagram of the way in which the electric energy generated by the FIGS. 2 and 3 thermoelectric modules is supplied to the electric loads of the helicopter.

The FIG. 4 schematic shows how thermoelectric modules 16 are employed on helicopter 1.

More specifically, thermoelectric modules 16 are connected to a number of electric loads C on helicopter 1 by a DC/DC conversion unit 27 and a distribution unit 28.

In the solution shown, electric loads C are defined by the main battery MB and auxiliary battery AB of helicopter 1, and by non-safety-critical mission loads, such as auxiliary radios, video downlinks, video-cameras, auxiliary displays, searchlights, winches, etc.

Conversion unit 27 stabilizes the voltage applied to electric loads C, to safeguard against significant fluctuations in the voltage of thermoelectric modules 16 caused by changes in temperature.

The input impedance of conversion unit 27 is preferably adjustable, for example, as a function of the temperature of thermoelectric modules 16, i.e. by applying a thermocouple to thermoelectric modules 16; and conversion unit 27 maximizes power transfer from thermoelectric modules 16 to electric loads C, and ensures a minimum output voltage compatible with loads C.

Distribution unit 28 comprises a number of switches 29 for selectively connecting respective electric loads C to conversion unit 27.

Power supply to electric loads C by distribution unit 28, i.e. opening/closing of switches 29, is controlled by a control unit 30 as a function of available electric power and the operating status of helicopter 1.

Available power can be calculated by control unit 30 on the basis of a related signal from conversion unit 27, or an internal algorithm, with no detection required.

Control unit 30 provides for:
monitoring the power connections and charge status of the batteries on helicopter 1;
charging the batteries when necessary;
controlling the switches;
cutting off power to unneeded electric loads; and
diagnosing malfunctions of electric loads C and the generators of helicopter 1.

Figure 6:
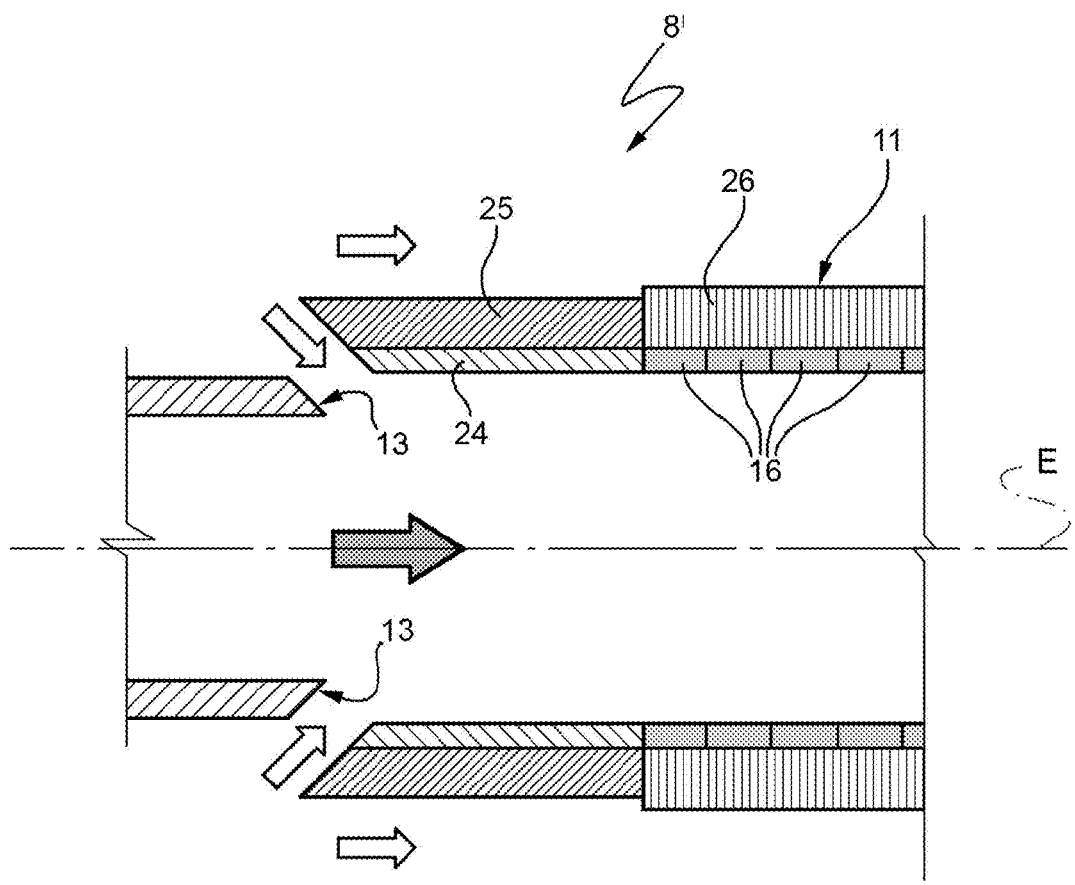
FIG. 6 shows a larger-scale axial section of a variation of the FIG. 5 exhaust duct.

Number 8' in FIG. 6 indicates as a whole an exhaust duct in accordance with a variation of the present invention, and the component parts of which are indicated, where possible, using the same reference numbers as for corresponding or equivalent parts of exhaust duct 8 already described.

In this case, thermoelectric modules 16 integrally define at least part of wall 24 of duct 8' at intermediate portion 11.

Thermoelectric modules 16 are connected mechanically to one another and to the rest of wall 24.

The advantages of helicopter 1 according to the present invention will be clear from the above description.

In particular, the solution described provides for converting part of the thermal energy lost in the exhaust gas directly into electric energy.

As stated, the electric energy recovered from the exhaust gas is used directly to charge the main and auxiliary batteries and other electric loads C of the helicopter, and so reduces the power draw from drive means 7. In prior known solutions, in fact, the main and auxiliary batteries and electric loads C of helicopter 1 were powered by respective generators connected to drive means 7.

Direct connection of thermoelectric modules 16 to the batteries and other electric loads C of helicopter 1 obviously provides for significant fuel saving, increasing fuel range, and so reducing harmful emissions, particularly $CO_2$.

Being relieved of the job of recharging the batteries and powering other electric loads C, the generators normally installed on helicopter 1 may be downsized to reduce weight and volume.

Similarly, being constantly recharged in all (routine and emergency) flying conditions, the batteries may be downsized, with respect to conventional solutions, and are no longer subject to certification regulations requiring a sufficient reserve to power essential electric loads for at least 30 minutes in emergency conditions.

All the above weight reductions provide for further fuel saving (by reducing the overall weight of the helicopter).

The additional Seebeck-effect electric energy supplied in all flying conditions also provides a solution to the electric power limitations at high altitude or in low-pitch ground conditions.

Another important advantage is in safety, by thermoelectric circuit 15 forming an additional electric power source by which to battery-power essential electric loads on helicopter 1, in the event both generators fail.

The innovative solution described also has the advantage of increasing the cooling margin and so reducing thermal stress of exhaust ducts 8, 8'.

The solution described and illustrated also has a long working life, no rotating parts, and requires no particular maintenance.

Finally, by converting heat from exhaust ducts 8, 8' to electric energy, the system described reduces the heat trail of helicopter 1, which is an important military advantage.

Clearly, changes may be made to helicopter 1 as described and illustrated herein without, however, departing from the protective scope defined in the accompanying Claims.

In particular, as opposed to 'elementary' modules, thermoelectric modules 16 may advantageously be in the form of 'macromodules', each defining an electric subnetwork, to increase the power output of each module.

In addition, heat-dissipating means 26 may be integrated in the structural mounts of exhaust ducts 8, 8'.

The invention claimed is:

1. An aircraft, capable of hovering, comprising:
   drive means; and
   at least one exhaust duct connected to an outlet of said drive means to expel exhaust gas, produced by fuel combustion, from the aircraft,
   wherein at least part of said exhaust duct comprises a thermoelectric conversion circuit for Seebeck-effect converting to electric energy a thermal gradient produced between an interior and an exterior of the exhaust duct by flow of said exhaust gas,
   wherein said exhaust duct comprises at least one air intake for conducting outside in-flight airflow into the exhaust duct,
   wherein said air intake is arranged upstream of said thermoelectric conversion circuit with reference to a flow direction in which the exhaust gas flows inside said exhaust duct, and
   wherein said air intake is inclined with respect to an axis of said exhaust duct and converges towards said axis along the flow direction of the exhaust gas so that the outside in-flight airflow mixes with the exhaust gas upstream of the thermoelectric conversion circuit to locally lower the temperature of the exhaust gas at said thermoelectric conversion circuit.

2. An aircraft as claimed in claim 1, wherein said thermoelectric conversion circuit comprises a plurality of thermoelectric modules connected in series and parallel to form a network, wherein the network is subjected to said thermal gradient.

3. An aircraft as claimed in claim 2, wherein each of said thermoelectric modules comprises a number of semiconductor junction cells fixed to a substrate.

4. An aircraft as claimed in claim 2, wherein said exhaust duct comprises a wall defining an interior passage for said exhaust gas, and said thermoelectric modules define at least a part of said wall.

5. An aircraft as claimed in claim 2, wherein said exhaust duct comprises a wall defining an interior passage for said exhaust gas, and said thermoelectric modules are fixed to an exterior face of said wall.

6. An aircraft as claimed in claim 5, further comprising a layer of heat-insulating material that is interposed between each of said thermoelectric modules and said wall to which each of said thermoelectric modules is fixed.

7. An aircraft as claimed in claim 2, wherein said exhaust duct comprises a heat-dissipating means affixed to the thermoelectric modules outside of the interior of the duct.

8. An aircraft as claimed in claim 2, wherein said thermoelectric modules are divided into groups, each comprising at least two of series-connected thermoelectric modules;
   said groups of thermoelectric modules being parallel-connected to one another.

9. An aircraft as claimed in claim 2, further comprising:
   at least one electric loan, and
   a DC/DC conversion unit connecting said thermoelectric modules to said at least one electric load, wherein the DC/DC conversion unit stabilizes a voltage applied to the electric loads.

10. An aircraft as claimed in claim 9, further comprising:
    a number of switches configured to selectively connect said at least one electric load to said DC/DC conversion unit, and
    a control unit configured to open and close said switches as a function of available electric power and an operating status of the aircraft.

11. An aircraft as claimed in claim 9, wherein said at least one electric load comprise a battery of said aircraft.

12. An aircraft as claimed in Claim 1, wherein the locally lowered temperature of the mixed exhaust gas is below a maximum operating temperature of the thermoelectric circuit.

* * * * *